United States Patent [19]
Holloway

[11] Patent Number: 6,072,715
[45] Date of Patent: Jun. 6, 2000

[54] MEMORY CIRCUIT AND METHOD OF CONSTRUCTION

[75] Inventor: Thomas C. Holloway, Murphy, Tex.

[73] Assignee: Texas Instruments Incorporated, Dallas, Tex.

[21] Appl. No.: 08/279,135

[22] Filed: Jul. 22, 1994

[51] Int. Cl.[7] .................................................. G11C 11/00
[52] U.S. Cl. .......................................... 365/156; 365/154
[58] Field of Search .................................. 365/154, 156, 365/178; 257/407

[56]  References Cited

U.S. PATENT DOCUMENTS

| | | | |
|---|---|---|---|
| 3,673,471 | 6/1972 | Klein et al. | 257/407 |
| 3,855,610 | 12/1974 | Masuda et al. | 257/407 |
| 4,132,904 | 1/1979 | Harari | 365/154 |
| 4,812,889 | 3/1989 | Kakumu | 257/407 |
| 5,020,029 | 5/1991 | Ichinose et al. | 365/154 |
| 5,070,482 | 12/1991 | Miyaji | 365/154 |
| 5,132,771 | 7/1992 | Yamanaka et al. | 365/154 |
| 5,134,581 | 7/1992 | Ishibashi et al. | 365/156 |
| 5,363,328 | 11/1994 | Browning et al. | 365/154 |
| 5,377,140 | 12/1994 | Usuki | 365/154 |

FOREIGN PATENT DOCUMENTS

| | | | |
|---|---|---|---|
| 55-151367 | 11/1980 | Japan | 257/407 |
| 60-45053 | 3/1985 | Japan | 257/407 |
| 62-245658 | 10/1987 | Japan | 257/407 |

OTHER PUBLICATIONS

F. Faggin et al., "Silicon Gate Technology," Solid–State Electronics, vol. 13, Aug. 1970, pp. 1125–1144.

R. Varshney, "Double Polysilicon Depletion–Mode MOS Transistor Structure," IBM Tech. Discl. Bull., vol. 22 #6, Nov. 1979, pp. 2292, 2293.

*Primary Examiner*—A. Zarabin
*Attorney, Agent, or Firm*—Carlton H. Hoel; W. James Brady; Frederick J. Telecky, Jr.

[57]  ABSTRACT

A memory circuit (10) is provided. The memory circuit comprises a flip-flop (12) and first and second pass gate transistors (14) and (16). The flip-flop (12) also comprises pull down transistors (18) and (20). The gate of each pull down transistor (18) and (20) is doped at a level that is greater than the doping level for each gate of pass gate transistors (14) and (16).

12 Claims, 2 Drawing Sheets

MEMORY CIRCUIT AND METHOD OF CONSTRUCTION

TECHNICAL FIELD OF THE INVENTION

This invention relates in general to the field of electronic circuits. More particularly, the invention relates to a memory circuit and method of Construction.

BACKGROUND OF THE INVENTION

Two design goals for memory circuits with multiple memory cells are increasing the speed of access to information in the memory circuit and also decreasing the size of the memory circuit. One factor controlling the speed of access to a memory cell is the ratio of the beta of the pull down gate transistor to the beta of the pass gate transistor in the cell. Beta is a characteristic of a transistor that is proportional to the transistor's width divided by its length and relates to the amount of current that can be passed between the source and drain of the transistor. The beta ratio impacts the stability of a memory cell and the speed of access to data stored in from the cell. A high beta ratio is desirable. A high beta ratio means that the pass gate transistor draws a low current in relation to the current of the pull down transistor.

A large beta ratio may be achieved by adjusting the widths of the pass gate and pull down transistors. For example, the width of the pass gate transistor may be decreased to increase the beta ratio. However, as memory cell size approaches the smallest dimensions for a given technology, the minimum transistor width supported by the technology sets the lower limit for the pass gate transistor. Therefore, decreasing the cell size by decreasing the width of the pull down transistor also decreases the beta ratio and thus the stability of the cell.

Heretofore known methods for increasing the beta ratio include increasing the length of the pass gate channel. However, this may have the undesirable effect of increasing word-line capacitance. Another known method for increasing the beta ratio includes either forming a thicker gate oxide or a higher threshold voltage for the pass gate transistor. However, each of these techniques also requires increased processing of the integrated circuit.

SUMMARY OF THE INVENTION

In accordance with the present invention, a memory circuit and method is provided that substantially eliminates or reduces disadvantages and problems associated with previously developed circuits and methods.

In one embodiment, the present invention provides a memory circuit. The memory circuit comprises a flip-flop for storing data. The flip-flop comprises first and second pull down transistors. A gate of each of the pull down transistors is doped at a first predetermined level. The memory circuit also comprises first and second pass gate transistors coupled to the flip-flop. A gate of each of the pass gate transistors is doped at a second predetermined level that is less than the first predetermined level. Data is read from and written to the flip-flop through the pass gate transistors.

A technical advantage of the present invention is that it increases the speed and stability of a memory cell without increasing the processing overhead required to fabricate the circuit. In one embodiment, the method of the present invention increases the ratio of the beta of the pull down transistor to the beta of the pass gate transistor by doping the pass gate transistor less than the gate of the pull down transistor. This reduces the amount of current needed to operate the pass gate transistor and thereby increases the speed and stability of the memory cell.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
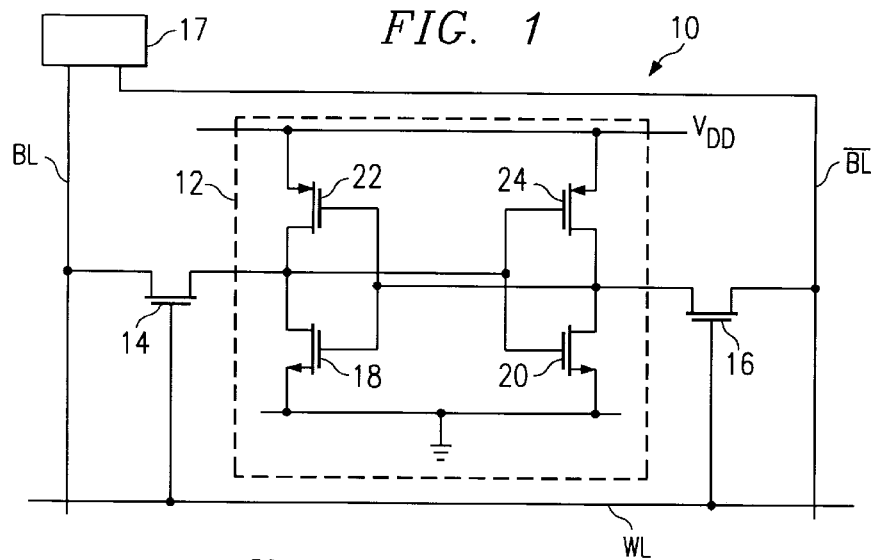
FIG. 1 is a schematic diagram of a memory circuit constructed according to the teachings of the present invention.

FIG. 1 is a schematic diagram of a memory circuit indicated generally at 10 and constructed according to the teachings of the present invention. Circuit 10 illustrates a single memory cell of a Static Random Access Memory (SRAM). It should be understood that a plurality of memory cells of the type shown in FIG. 1 may be coupled together to form an entire SRAM device. For sake of clarity, only a single memory cell is shown in FIG. 1. Circuit 10 increases the stability and speed of access by adjusting the doping levels of polycrystalline silicon gates of particular, selected transistors in circuit 10.

Circuit 10 may comprise, for example, a flip-flop 12 and first and second pass gate transistors 14 and 16. First and second pass gate transistors 14 and 16 may comprise, for example, NMOS transistors. A gate of each transistor 14 and 16 may be coupled to a word line WL and a source or drain of transistors 14 and 16 may be coupled to a bit line BL or an inverse bit line $\overline{BL}$ as shown in FIG. 1. Bit line BL, inverse bit line $\overline{BL}$ and word line WL provide access to the data stored in circuit 10. Bit line BL and inverse bit line BL may be coupled to a sense amplifier 17 for reading the value stored in circuit 10.

Flip-flop 12 may comprise, for example, a CMOS flip-flop, an NMOS flip-flop or any other appropriate circuit for storing data. As shown, flip-flop 12 comprises a CMOS flip-flop. Flip-flop 12 comprises first and second pull down transistors 18 and 20, respectively, and first and second pull up transistors 22 and 24, respectively. Pull down transistors 18 and 20 may comprise NMOS transistors. Alternatively, pull up transistor 22 and 24 may comprise NMOS transistors or pull up resistors. Pull up transistors 22 and 24 may comprise PMOS transistors. A source of transistor 22 and a source of transistor 24 transistor 24 are coupled to a constant voltage supply VDD. A drain of transistor 22 is coupled to a drain of transistor 18. A drain of transistor 24 is coupled to a drain of transistor 20. A source of transistor 18 and a source of transistor 20 are both coupled to a ground potential. A gate of transistor 22 is coupled to a gate of transistor 18. A gate of transistor 24 is coupled to a gate of transistor 20. A gate of transistor 18 is also coupled to a drain of transistor 24 and a drain of transistor 20. A gate of transistor 20 is coupled to a drain of transistor 22 and a drain of transistor 18. Pass gate transistor 14 is coupled to flip-flop 12 at the drain of transistor 22 and the drain of transistor 18. Pass gate transistor 16 is coupled to the drain of transistor 24 and the drain of transistor 20.

As described below with respect to FIGS. 2a through 2e, pass gate transistors 14 and 16 and pull down transistors 18 and 20 may comprise polycrystalline silicon doped to render it conductive. In one embodiment of the present invention, the gate of pull down transistors 18 and 20 may be doped at a level that is higher than the doping level of the gate of pass gate transistors 14 and 16. The variation in doping level increases the beta ratio of circuit 10 even though the width of transistors 14, 16, 18 and 20 may be substantially similar or identical. This increases the stability and speed at which circuit 10 may operate without requiring additional processing steps or increasing word line capacitance.

In operation, circuit 10 operates in substantially the same manner as a traditional static random access memory cell. However, circuit 10 is more stable than a traditional memory cell because the gates of pull down transistors 18 and 20 are doped at a higher level than the gates of pass gate transistor 14 and 16. Therefore, pass gate transistors 14 and 16 operate at a reduced current level. This increases the speed and stability of circuit 10.

Figure 2A:
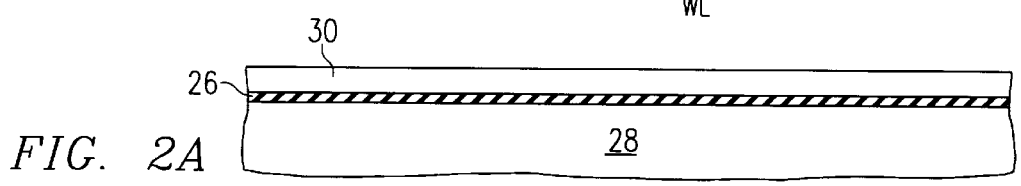
FIG. 2a through 2e are cross-sectional elevational diagrams which illustrate a method of constructing the memory circuit of FIG. 1.

FIGS. 2a through 2e are cross-sectional elevational diagrams which illustrate a method of constructing circuit 10 of FIG. 1. Referring to FIG. 2a, a gate insulator layer 26 is formed outwardly from a semiconductor substrate 28. Gate insulator layer 26 may comprise silicon dioxide or any other appropriate insulator material. Semiconductor substrate 28 may comprise, for example a single crystalline silicon or other appropriate semiconductor material. A semiconductor layer 30 is deposited outwardly from gate oxide layer 26. Layer 30 is used to create the gate electrode of the transistors of circuit 10 and may comprise, for example, polycrystalline silicon or other appropriate semiconductor material.

Figure 2B:
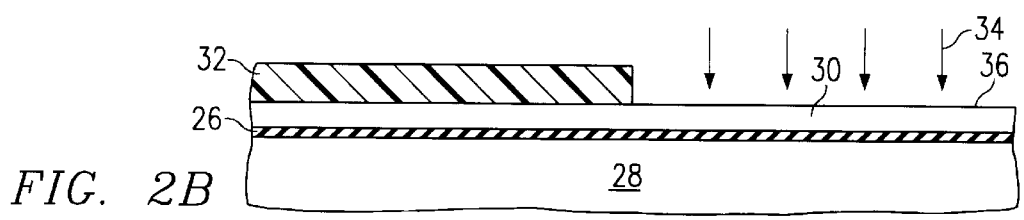

Referring to FIG. 2B, a masking layer 32 is deposited and patterned outwardly from layer 30. Masking layer 32 may comprise, for example, photoresist or other appropriate masking material. Arrows 34 indicate the introduction of dopant species via a doping procedure. This doping procedure may comprise, for example, ion implantation or other appropriate doping procedure. In the case of ion implantation, appropriate ions may be accelerated in an electric field toward a surface 36 of layer 30. The ions strike surface 36 and may become embedded in layer 30. The ions may comprise, for example, phosphorous ions or other appropriate ions for selectively increasing the conductivity of layer 30. Masking layer 32 is removed from surface 36 of layer 30.

Figure 2C:
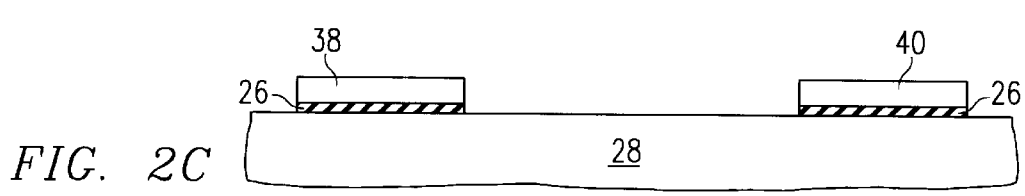

Referring to FIG. 2c, layer 30 is patterned and etched to produce first and second gates 38 and 40. Gate 38 comprises a semiconductor body that has not been subjected to the doping procedure described previously. Gate 40 comprises a semiconductor body that has been doped as described previously.

Figure 2D:
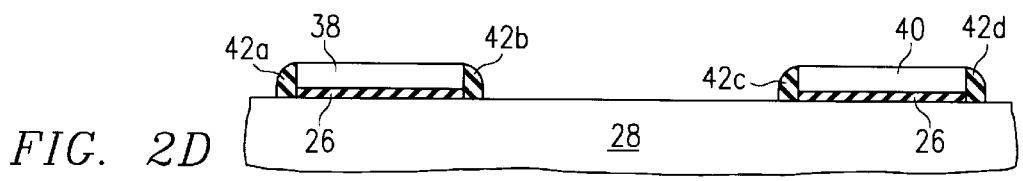

Referring to FIG. 2d, spacers 42a through 42d may be formed outwardly from semiconductor substrate 28. Spacers 42a through 42d may be formed by a conformal deposition of an appropriate insulating material such as an oxide. Once deposited, the oxide layer may be etched using an anisotropic etch to form spacers 42a through 42d.

Figure 2E:
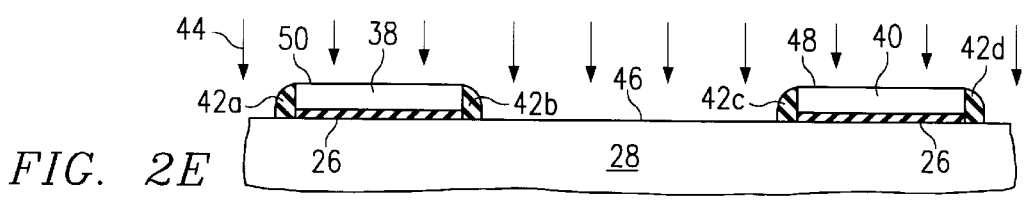

Referring to FIG. 2e, arrows 44 illustrate a second doping procedure such as an ion implantation or other appropriate procedure. In the case of ion implantation, appropriate ions are accelerated in an electric field toward surface 46 of semiconductor substrate 28, surface 50 of gate 38, and surface 48 of gate 40. The ions may comprise, for example, phosphorous or other appropriate ions for creating source and drain implants in semiconductor substrate 28. Gates 38 and 40 are also doped during this step.

Through the process illustrated in FIGS. 2a through 2e, gate 40 is doped at a higher level than gate 38. Therefore, the process described in FIGS. 2a through 2e may be used to properly dope the gate of pass gate transistors 14 and 16 and the gate of pull down transistors 18 and 20 of circuit 10 of FIG. 1. The gate of pass gate transistors 14 and 16 may be doped in a manner similar to gate 38 of FIGS. 2a through 2e. Additionally, the gate of pull down transistors 18 and 20 may be doped in a manner similar to gate 40 of FIGS. 2a through 2e.

Gates 38 and 40 are shown side-by-side in cross sectional FIGS. 2a through 2e by way of example and not by way of limitation. The gates of pass gate transistors 14 and 16 do not need to be fabricated adjacent to the gate of pull down transistors 18 and 20. The gates of these devices may actually be spaced apart or askew to one another in the actual layout of the device without affecting the advantages of the teachings of the present invention described herein. Gates 38 and 40 are shown side-by-side only for convenience in describing the teachings of the present invention.

The effect of the difference in doping level between the pass gate transistors 14 and 16 and pull down transistors 18 and 20 is illustrated in the following experimental results. In the experiment, memory circuits were fabricated on four experimental wafers. The width to length ratio of the pass gate transistor comprised 11.9 micrometers to 0.5 micrometers. In TABLE 1 below, columns 1 and 2 include data for transistors in which the gate electrodes were doped as gate 38 in FIGS. 2a through 2e to be used as pass gate transistors 14 and 16. Columns 3 and 4 show data of transistors in which the gate electrodes were doped as gate 40 in FIGS. 2a through 2e to be used as pull down transistors 18 and 20.

TABLE 1

| Transistor Characteristics | 1 | 2 | 3 | 4 |
| --- | --- | --- | --- | --- |
| Drive Current of pass gate transistor (in mA) | 0.471 | 0.472 | 0.513 | 0.530 |
| Beta of pass gate transistor ($\mu A/V^2$) | 215 | 207 | 263 | 274 |

This experimental data indicates that the beta ratio resulting from using pass gate transistors having gate electrodes doped as gate 38 (table 1, columns 1 and 2) and pull down transistor gate electrodes doped as gate 40 (table 1, columns 3 and 4) will result in a SRAM transistor beta ratio substantially higher than in the case where pass gate and pull down transistors have the same gate electrode doping level.

Figure 3:
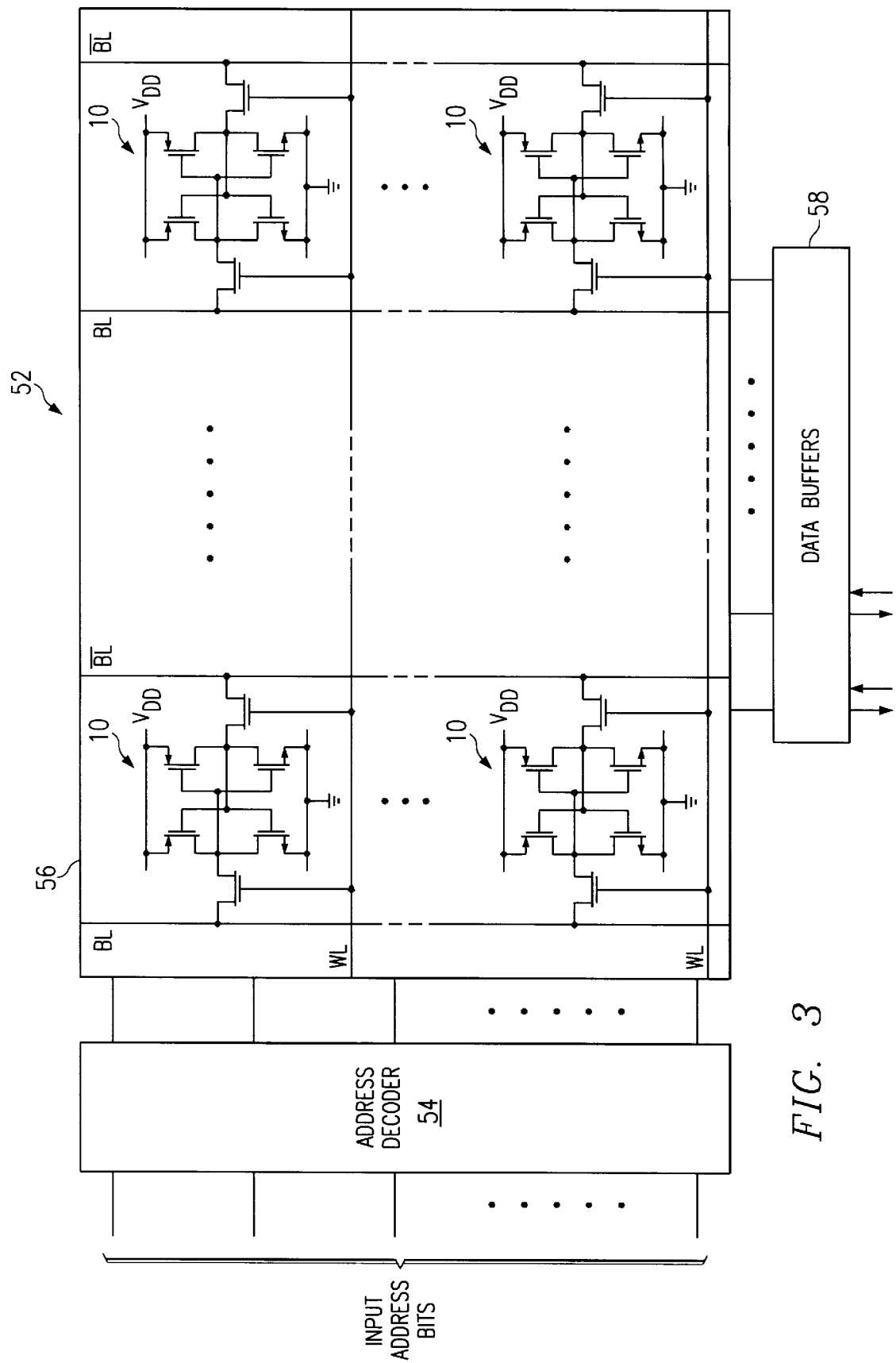
FIG. 3 illustrates a memory device including a plurality of memory cells constructed according to the teachings of the present invention.

FIG. 3 is a block diagram of a memory device indicated generally at 52 that includes a plurality of memory circuits 10 and is constructed according to the teachings of the present invention. Memory device 52 comprises an address decoder 54, an array of memory cells 56, and a data buffer 58. Address decoder 54 is coupled to receive an input address from an external system (not shown). Address decoder 54 is coupled to memory array 56. Memory array 56 comprises a plurality of memory cells 10 of FIG. 1. Memory cells 10 are individually addressable. Each memory cell 10 is coupled to a bit line labelled BL, an inverse bit line labelled $\overline{BL}$, and a word line labelled W. As with FIG. 1, the gates of pass gate transistors 14 and 16 are doped at a level that is lower than the doping level for pull down transistors 18 and 20. Memory array 56 is also coupled to data buffer 58 which provides output to and input from an external system.

In operation, memory device 52 operates in a manner similar to conventional static random access memory devices. The speed and stability of memory device 52 is increased by implementation of memory cells 10 of FIG. 1.

Although the present invention has been described in detail, it should be understood that various changes, substitutions and alternations can be made hereto without departing from the spirit and scope of the invention as defined by the appended claims. For example, flip-flop 12 is shown to be a CMOS static random access memory cell. Alternatively, flip-flop 12 may comprise an NMOS static random access memory cell. Furthermore, the variation in doping between the gate of the pass gate transistor and the gate at the pull down transistor may be adjusted to achieve virtually any desirable beta ratio.

What is claimed is:

1. A memory circuit, comprising:
    a flip-flop circuit for storing data having first and second pull down transistors, a gate of each of said pull down transistors having a first predetermined conductivity level; and
    first and second pass gate transistors coupled to said flip-flop, a gate of each of said pass gate transistors having a second predetermined conductivity level less than said first predetermined level wherein data is read from and written to said flip-flop through said pass gate transistors.

2. The circuit of claim 1 and further comprising a sense amplifier coupled to an output of said pass gate such that said sense amplifier is operable to read said data stored in said flip-flop.

3. The circuit of claim 1, wherein a gate of each of said pull down transistors has a first predetermined conductivity level achieved by doping a semiconductor material and a gate of each of said pass gate transistors has a second predetermined conductivity level achieved by doping a semiconductor material.

4. The circuit of claim 1, wherein said flip-flop further comprises first and second NMOS pull up transistors and said pull down transistors comprise NMOS transistors.

5. The circuit of claim 1, wherein said flip-flop further comprises first and second pull up resistors.

6. The circuit of claim 1, wherein said flip-flop comprises first and second NMOS pull down transistors and first and second PMOS pull up transistors.

7. A memory device, comprising:
    an address decoder for receiving an address of the memory device;
    a data buffer for reading and writing data; and
    an array of memory cells, coupled to said address decoder and said data buffer, each said memory cell comprising:
        a flip-flop circuit for storing data having first and second pull down transistors, a gate of each of said pull down transistors having a first predetermined conductivity level; and
        first and second pass gate transistors coupled to said flip-flop, a gate of each of said pass gate transistors having a second predetermined conductivity level less than said first predetermined level wherein data is read from and written to said flip-flop through said pass gate transistors.

8. The device of claim 7 and further comprising a sense amplifier coupled to an output of said pass gate such that said sense amplifier is operable to read said data stored in said flip-flop.

9. The device of claim 7, wherein a gate of each of said pull down transistors has a first predetermined conductivity level achieved by doping a semiconductor material and a gate of each of said pass gate transistors has a second predetermined conductivity level achieved by doping a semiconductor material.

10. The device of claim 7, wherein said flip-flop further comprises first and second NMOS pull up transistors and said pull down transistors comprise NMOS transistors.

11. The device of claim 7, wherein said flip-flop comprises first and second NMOS pull down transistors and first and second PMOS pull up transistors.

12. The device of claim 7, wherein said flip-flop further comprises first and second pull up resistors.

* * * * *